(12) United States Patent
Schober et al.

(10) Patent No.: US 9,780,752 B2
(45) Date of Patent: Oct. 3, 2017

(54) ASSEMBLY WITH AN ANALOG DATA PROCESSING UNIT AND METHOD OF USING SAME

(75) Inventors: Armin Schober, Munich (DE); Gino Rocca, Copenhagen (DK); Troels Andersen, Smorum (DK)

(73) Assignee: TDK Corporation, Tokyo (JP)

( * ) Notice: Subject to any disclaimer, the term of this patent is extended or adjusted under 35 U.S.C. 154(b) by 457 days.

(21) Appl. No.: 14/117,273

(22) PCT Filed: Jun. 1, 2011

(86) PCT No.: PCT/EP2011/059098
§ 371 (c)(1),
(2), (4) Date: Mar. 8, 2014

(87) PCT Pub. No.: WO2012/163424
PCT Pub. Date: Dec. 6, 2012

(65) Prior Publication Data
US 2014/0185832 A1    Jul. 3, 2014

(51) Int. Cl.
 H03G 5/16      (2006.01)
 H03G 3/30      (2006.01)
 H04R 3/00      (2006.01)
(52) U.S. Cl.
 CPC .............. *H03G 5/16* (2013.01); *H03G 3/301* (2013.01); *H04R 3/00* (2013.01); *H04R 2410/00* (2013.01)
(58) Field of Classification Search
 None
 See application file for complete search history.

(56) References Cited

U.S. PATENT DOCUMENTS

| | | |
|---|---|---|
| 4,454,384 A | 6/1984 | Ferrieu et al. |
| 4,677,678 A | 6/1987 | McCutchen |
| 6,229,397 B1 | 5/2001 | Miura |
| 6,392,479 B2 | 5/2002 | Miura |
| 6,628,795 B1 | 9/2003 | Ludvigsen |
| 7,005,922 B2 | 2/2006 | Oshima et al. |
| 8,290,181 B2 | 10/2012 | Stokes, III et al. |
| 2006/0210096 A1* | 9/2006 | Stokes, III ............. H03G 3/301 381/107 |
| 2009/0001553 A1 | 1/2009 | Pahl et al. |
| 2009/0187065 A1* | 7/2009 | Basinger ............ A61N 1/36032 600/25 |
| 2009/0316916 A1* | 12/2009 | Haila ..................... H04R 3/005 381/57 |

FOREIGN PATENT DOCUMENTS

| | | |
|---|---|---|
| EP | 0987819 A2 | 3/2000 |
| EP | 1130772 A2 | 9/2001 |
| JP | 5421240 A | 2/1979 |

(Continued)

*Primary Examiner* — Curtis Kuntz
*Assistant Examiner* — Qin Zhu
(74) *Attorney, Agent, or Firm* — Slater Matsil, LLP

(57) ABSTRACT

An assembly includes an analog signal processing unit. An analog signal path and an amplifier an automatic gain control unit are coupled to the signal path. Further to the output of the amplified analog signal, a gain information is provided as an analog or digital signal at a gain information output. This information can be used for further processing the signal, e.g., by automatic noise compression or to control further signal processing units.

8 Claims, 3 Drawing Sheets

(56) References Cited

FOREIGN PATENT DOCUMENTS

| | | |
|---|---|---|
| JP | 200091864 A | 3/2000 |
| JP | 2001251152 A | 9/2001 |
| JP | 2004320196 A | 11/2004 |
| JP | 2006203740 A | 8/2006 |
| JP | 2006270949 A | 10/2006 |
| JP | 2009514691 A | 4/2009 |
| JP | 2009111519 A | 5/2009 |
| WO | 2006012578 A2 | 2/2006 |
| WO | 2009143434 A2 | 11/2009 |

* cited by examiner

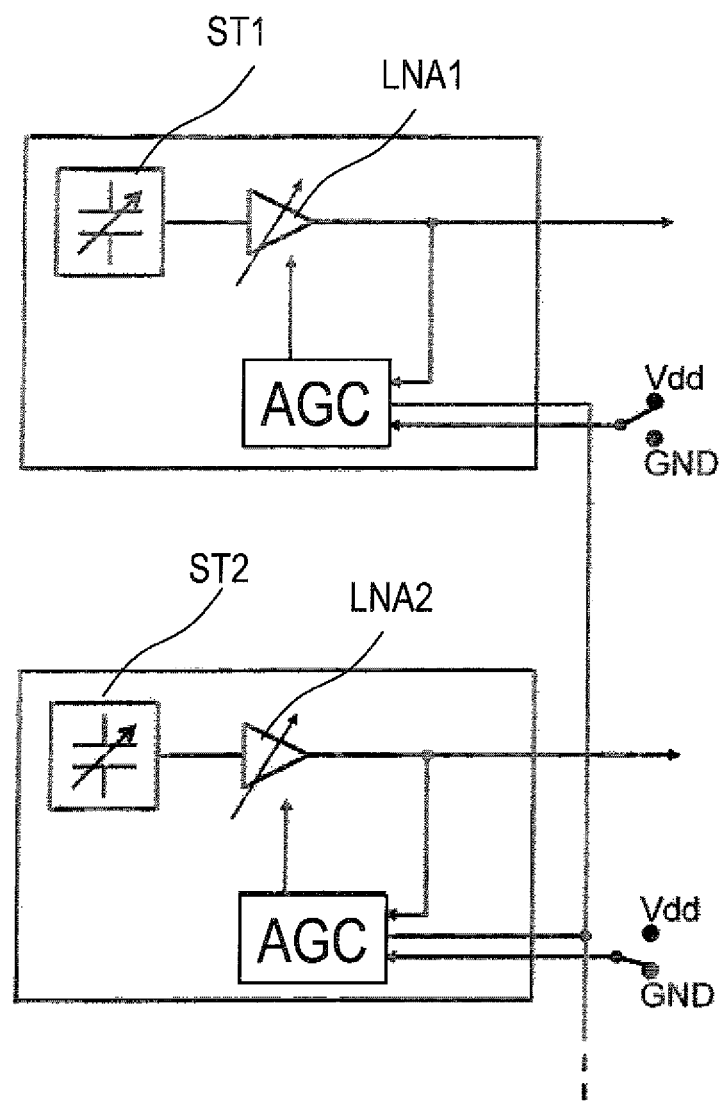

ASSEMBLY WITH AN ANALOG DATA PROCESSING UNIT AND METHOD OF USING SAME

This patent application is a national phase filing under section 371 of PCT/EP2011/059098, filed Jun. 1, 2011, and is incorporated herein by reference in its entirety.

TECHNICAL FIELD

The invention relates to an analog data processing unit with an amplifier. Particularly, it relates to sensor assembly like a microphone assembly having a new interface at its output.

BACKGROUND

A sensor assembly comprises for example a sensor measuring or detecting a physical parameter and providing an analog sensor signal to an amplifier. Usually the sensor assembly has a dynamic range within which linear amplification is guaranteed. Analog sensor signals having a value extending this range may be distorted by saturation of the amplifier.

For measuring parameters within a greater range of signal amplitudes the sensitivity of the sensor or the gain of the amplifier has to be reduced leading to values of reduced signal to noise ratio.

International Patent Publication No. WO 2009/143434 A2 describes a microphone assembly is known comprising two microphones having different dynamic ranges. From the signals amplified by the two microphones an external selector selects and switches to that microphone being best matched to the incoming signal level, i.e., to the incoming sound pressure level.

One disadvantage of this assembly is that the second microphone requires double circuitry and thus, double effort.

U.S. Pat. No. 6,628,795 B1 describes a hearing aid comprising an automatic gain control varying a gain of the hearing aid in response to a detected sound level such that the hearing aid may work within a desired range below a clipping or pain threshold. In a multichannel hearing aid, independent gain control units are used for each channel. Problems arise when trying to actively cancel noise with an ANC (=active noise canceling) method using the multiple signals of the multichannel hearing aid.

SUMMARY OF THE INVENTION

Embodiments of the invention to provide a signal processing unit that may be used in a sensor assembly like a microphone and providing a wider dynamic range thereby reducing the effort of known microphone assemblies or allowing ANC.

The invention provides an assembly with an analog signal processing unit with an automatic gain control unit having advanced functionality. The assembly comprises an analog signal input and an analog signal output as well as a signal path coupled between the signal input and the signal output. Along the signal path the wanted signal propagates or is propagated as an electric signal from the analog signal input to the analog signal output. A first amplifier within the signal path is coupled to the analog signal input. An automatic gain control unit is coupled to the signal path and controls the gain of the amplifier in respect of a signal amplitude within the signal path. Information about the current gain at the amplifier is delivered as a digital or analog gain information to a gain information output at the interface between the signal processing unit and an external circuitry.

An automatic gain control unit that can be used within the signal processing unit may be construed in a common way well known from the art and described, e.g., in U.S. Pat. No. 6,628,795 B1 which is herewith incorporated by reference. But further to known assemblies with signal processing units, the invention provides a new functionality by the gain information output. Hence, the gain control unit does not only provide a closed loop but produces a digital signal delivered to the gain information output at the interface where it can be taken as a parameter for further signal processing. As far as the processing unit is a closed system within a casing, the gain information output is a further terminal of this system.

Usually, all components of the signal processing unit can be integrated and realized by an integrated circuit. Hence, only one further terminal for the gain information output is required compared to a known processing unit without that gain information output.

In one embodiment, at least one second signal path and one second amplifier coupled to the second signal path and to the gain information output at the interface of the first signal path is provided such that first and second amplifier can be controlled by the same gain.

The second signal path may comprise an own automatic gain control unit. As an advantage, two identical processing units can be used and coupled together by their respective gain information output. In this case, one of the automatic gain controls must be deactivated by setting the status of the respective automatic gain control unit to "slave" whereas the status of the first gain control unit is set to "master."

In a further embodiment, the second signal path differs from the first signal path by not comprising an automatic gain control. In this case, the amplifier of the second signal path is directly controlled by the gain information taken from the gain information output of the first signal path. This needs two different processing units but provides a solution with a reduced complexity in regard of the first embodiment.

In a preferred implementation, a transducer of a sensor is coupled to the analog signal input in at least one of the first and the second signal path. The transducer detects and measures a physical parameter, produces an analog signal that is proportional to the detected value of the parameter and delivers this signal as an input to the analog signal path.

In this configuration, the analog transducer signal is amplified within the processing unit using automatic gain control. This guarantees that a given threshold which is due to clipping of the amplifier or due to a given amplitude limit in an external circuitry is kept by the processing unit. The transducer itself has a range that covers or extends the summed dynamic range of the signal path. The digital or analog gain information taken from the gain information output is assigned to the analog signal derived at the analog signal output of the signal path. Hence, it can always be detected whether the signal amplitude is the result of maximum gain or the result of a gain that is reduced relative to the maximum gain. This may be advantageous when trying to get exact information about the value of this detected physical parameter. Further, the gain information can be used to control the gain of a second sensor if the two signal outputs of the two signal paths have to be combined to retrieve any directional information there from.

In one embodiment, each of the first, second, and, maybe, a further signal path is arranged within a separate casing. The different casings are coupled via their respective interfaces. In this embodiment, the gain information output at the interface of each casing allows to couple a given number of different sensor units to a common assembly, thereby synchronizing the gain of each amplifier in the different signal paths that further data processing can be done on base of exact data (exact signal amplitudes) at a later stage within the processing unit or within an external circuitry.

The casing can provide an electro-magnetic shield to the signal processing unit. For this purpose, the casing comprises at least one metallic layer for capacitive or magnetic shielding. In the case, a transducer of a sensor is coupled to the analog data input this will usually need an opening in the casing that the transducer may come into contact with the ambient to detect the physical parameter. The transducer of the sensor is commonly arranged within the casing of the signal processing unit for guarantying short electrical interconnections and avoiding electric losses of the usually weak signal produced by the transducer.

The transducer signal is an analog one. In a preferred embodiment, the analog amplified signal is converted to a digital one by coupling the analog data output to an analog-to-digital converter, e.g., a $\Sigma\Delta$-modulator. Such a converter is simple and easy to realize within an integrated circuit.

Hence, it is possible to integrate a low-noise amplifier, the automatic gain control unit, a clock generator, and said analog-to-digital converter within one common integrated circuit realized as an ASIC. A clock is necessary for the $\Sigma\Delta$-modulator and for all those cases where two or more signal processing units are present. A clock is used to synchronize these different signal paths and to trigger the $\Sigma\Delta$-modulator.

A preferred source of an analog signal stream in a sensor assembly is a MEMS transducer. The transducer can work as a capacitor where the capacitance between a fixed electrode and a membrane are used to detect a pressure difference or a varying pressure like an incoming sound wave.

In a further embodiment, the transducer may be an electret microphone. The sensor may be a gyro sensor that can detect and measure any rotational position deviating from a given normal position. The sensor can also be an inertial sensor, measuring direction and value of an acceleration. The sensor can be a force detector measuring a tensile or torsional loading, or a chemical sensor continuously detecting the concentration of a component in the ambient.

In an assembly comprising a number of identical signal processing units coupled to a respective sensor transducer, provisions are made to control the gain of the second and the further amplifiers by the automatic gain control of the first amplifier. One possibility is to provide a further terminal coupled to each signal processing unit, the further terminal providing information about or setting the status of the respective signal processing unit to "master" or "slave." Only one of the multitude of identical signal processing units acts as a master, the others should act as slaves.

In an embodiment of the invention, a method for widening the dynamic range of an MEMS microphone is given. The dynamic range has to be widened in all those cases where the transducer used to sense the sound waves (sound pressure level) has a broader range than the following signal processing unit coupled to the transducer.

The method comprises the following steps:
sensing a sound pressure impacting on a MEMS transducer;
coupling an analog signal corresponding to the sound pressure to an analog signal input of a signal path;
amplifying the analog signal by an amplifier coupled to the signal path;
detecting an amplitude of the signal within the signal path;
controlling the gain of the amplifier in response to the detected amplitude compared with a given threshold;
submitting a digital information about the current gain of the amplifier to a gain information output;
running an amplifier within a second signal path with the same gain as the first amplifier according to the signal received via the gain information output.

In this method, a signal processing unit as described above is used which delivers a gain information output about the current gain of the amplifier to the interface between the signal processing unit and an external circuitry which, in this case, is the at least one further signal processing unit.

BRIEF DESCRIPTION OF THE DRAWINGS

In the following, the invention will be described in more detail with reference to embodiments and the respective drawings. The figures are drawn schematically only and do not show all details of the assembly. Further, the figures are not drawn to scale.

FIG. 6 shows an assembly of two coupled microphones where one of the microphones is set to act as "master."

DETAILED DESCRIPTION OF ILLUSTRATIVE EMBODIMENTS

Figure 1:
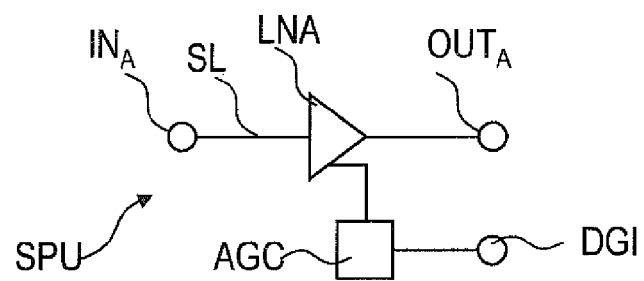
FIG. 1 shows a signal processing unit that can be used within an assembly of the invention.

FIG. 1 shows, in a simple and schematic drawing, a first signal processing unit as used in an assembly according to the invention. A signal path SL guides from an analog signal input $IN_A$ to an analog signal output $OUT_A$. Within the signal path SL, an amplifier LNA is arranged to amplify the useful analog signal fed to the analog signal input and guides the amplified signal to the analog output.

Coupled to the signal path and the amplifier LNA is an automatic gain control AGC controlling the gain of the amplifier. Gain information about the current gain is provided by the automatic gain control as a digital or analog signal which is delivered to a gain information output DGI. Thus, the signal processing unit SPU comprises an analog signal output $OUT_A$ and further the gain information output DGI. The outputted signals can be handled in an usual way but as a further information, gain settings can be taken from the gain information output. This information may be useful for further processing the analog signal where information about the sensitivity of the signal processing unit is needed. The automatic gain control AGC is connected to the signal path SL at a node near the amplifier LNA and is preferably coupled to a node between the amplifier and the analog signal output.

The automatic gain control unit AGC comprises a level comparator comparing the detected signal level at the point where the automatic gain control unit AGC is connected to the signal path SL with a given level and feeding back this information to the amplifier LNA to control the gain with respect to the result of the comparison. If the signal level extends beyond the level, the gain of the amplifier LNA is reduced. The automatic gain control unit AGC may comprise at least one such level and digitally switches the gain between a respective number of different gain settings. A first gain setting used for high sensitivity and low-amplitude signals may differ from the second gain used for high-amplitude signals by −20 dB. Hence, small amplitude signals are subject to a higher amplification gain than signals with high amplitudes. This allows to process signals within a wide dynamic range. With the lower gain, linear signal amplification is possible up to 140 dB SPL, for example. This matches future requirements for microphones in mobile phones that they may be used in loud ambiences.

Figure 2:
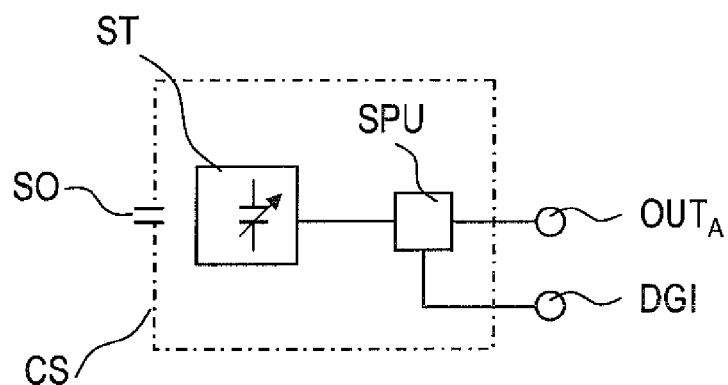
FIG. 2 shows an assembly comprising the signal processing unit coupled to a sensor transducer and arranged inside a casing.

FIG. 2 shows a real application of the signal processing unit SPU. A sensor transducer ST is coupled to the analog signal input $IN_A$ of the signal processing unit SPU. The sensor transducer ST may be a MEMS microphone working as a variable capacitor whose capacitance varies with the displacement of a membrane on which incoming sound impacts. Sensor transducer ST and signal processing unit SPU may be arranged inside a casing CS that seals the assembly and that may provide a shielding against electromagnetic interference.

When embodied as a microphone, a sound inlet opening SO near the sensor transducer input is left in the casing CS. All signal processing is done within the signal processing unit within a single IC chip and the processed signals and information are fed to the terminals arranged on the casing CS. According to the invention, one of the terminals is the analog signal output delivering amplified signals whereas another terminal is the gain information output DGI.

Further terminals may be provided for a ground connection, supply voltage, clock signal, and left/right information if the assembly comprises at least two signal processing units SPU, e.g., in a stereo application or in an assembly providing active noise cancelling with a second or further microphones.

Figure 3:
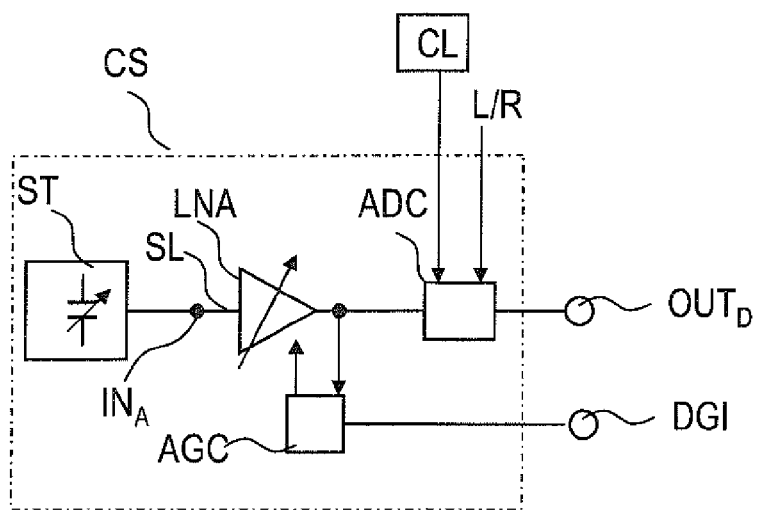
FIG. 3 shows an embodiment according to FIG. 2, further comprising an analog-to-digital converter.

FIG. 3 shows a similar assembly like FIG. 2, further comprising an analog-to-digital converter ADC coupled to the signal path SL between amplifier LNA and digital signal output OUTD. The sensor transducer ST comprises a membrane to act as a microphone and the shown assembly is arranged within a casing CS according to a preferred embodiment of a digital microphone. The analog-to-digital converter ADC may be embodied as a ΣΔ-modulator providing a pulse density modulated data stream. Such a modulator delivers a series of ones whose density is dependent on the magnitude of the analog signal. In this embodiment, the terminal for analog signal output is replaced by a terminal for digital signal output at the interface of the assembly.

A clock CL produces a clock signal delivered to the analog-to-digital converter ADC as well a left/right information input L/R may be connected to the ADC.

Figure 4:
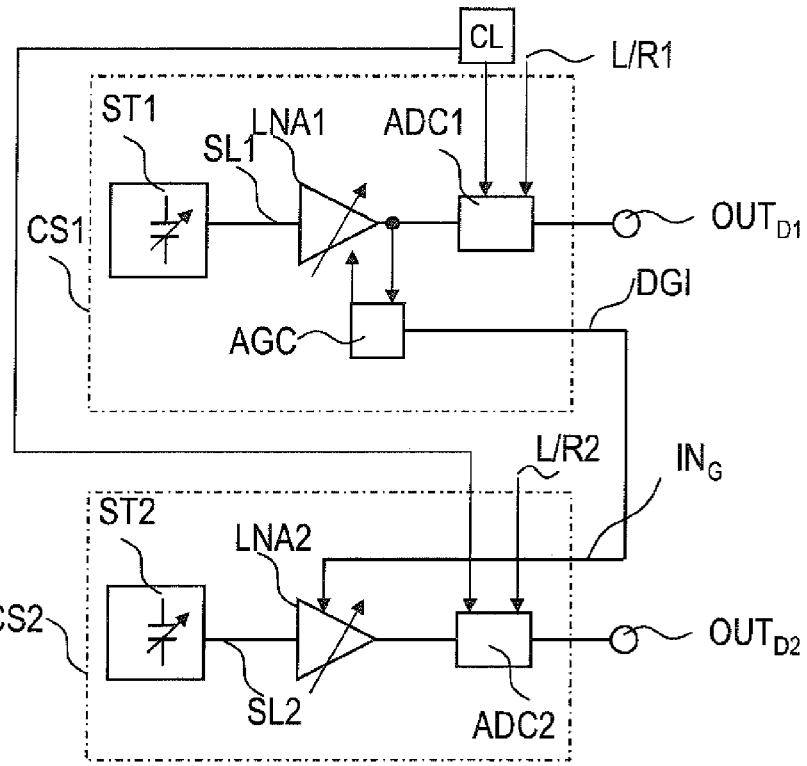
FIG. 4 shows an assembly comprising two microphones coupled together by the gain information output.

FIG. 4 shows an assembly where two digital microphones according to the invention are coupled together using the gain information output DGI of the first microphone. The second microphone arranged in a second casing CS2 comprises the sensor transducer ST2 coupled via the signal path SL2 to an amplifier LNA2. The amplified analog signals in both signal paths are converted to digital ones by a respective analog-to-digital converter ADC and fed to the digital signal outputs $OUT_{D1}$, $OUT_{D2}$. The first microphone arranged in the first casing CS1 may be construed like the microphone shown in FIG. 3 as explained above. In this assembly, the automatic gain control unit AGC of the first microphone controls the gain of the first microphone, provides the gain information to the gain information output DGI, couples this information to the gain information input $IN_G$ of the second signal processing unit SPU2 there directly controlling the gain of the second amplifier LNA2 to be driven by the same gain. By the way, the two microphones are always run with the same gain as both amplifiers are controlled by the same gain control AGC.

The assembly may comprise a third or further microphones embodied like the second microphone and connected via the gain information input $IN_G$ to the gain information output DGI of the first microphone. A clock signal and left/right information L/R may be delivered to each analog-to-digital converter ADC.

Figure 5:
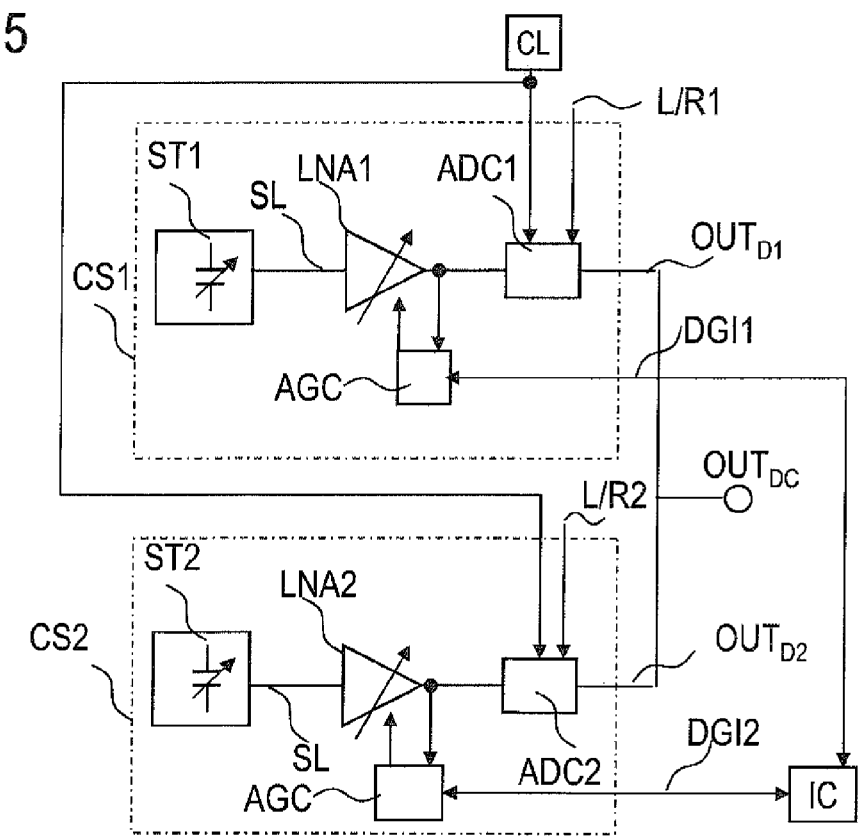
FIG. 5 shows an arrangement where two microphones are coupled together in a stereo configuration.

FIG. 5 shows an example how two microphones according to the invention could be used in a stereo application. Each microphone and its respective signal processing unit including an analog-to-digital converter ADC is arranged in a separate casing CS. In the figure, further terminals at the interface and periphery components are depicted. A clock CL, terminals for left/right information L/R, for digital signal output $OUT_D$ and an IC for combining gain information from first and second automatic gain controls, are shown. The amplified and digitized signal data delivered to the digital signal output $OUT_D$ can be combined at a combined digital output $OUT_{Dc}$. The assembly may comprise a third or more microphones whose digital outputs $OUT_D$ may be coupled with the combined digital output $OUT_{Dc}$. Similarly, the gain information taken from the gain information output DGI can be led to the integrated circuit IC providing a logic combining and controlling the gain information. The gain information may be used to further process the digital output data of the different microphones or may be used to feed back this information to the automatic gain control of the respective microphones.

In the stereo application shown in FIG. 5, the clock signal generated by the clock CL is used to separate between data received from the first and second microphone (left/right) and to make valid only one kind of data source during one clock period which is defined between two edges of the clock signal. In the first microphone, the left/right information terminal may be connected to the ground terminal while in the second microphone, the left/right information terminal may be connected to the supply voltage. This kind of assembly is very similar to a known stereo assembly with the exception of the gain information output which is combined in the present assembly in an external integrated circuit IC containing the logic for combining this information.

FIG. 6 shows an embodiment where two identical microphones according to the invention are combined by coupling together the gain information output terminals via a conductor line. In this embodiment, a further terminal per each microphone is necessary to set the information about which of the two microphones acts a master and which of the microphones acts as a slave. This setting can be done by connecting the additional terminal either to ground (for a slave microphone) or to a given voltage potential VDD, for example, which stands for the master setting.

Alternatively, the additional terminal per each microphone might be saved if the setting for each microphone, whether it should act as a master or a slave, is done by a switch which is located within the microphone housing or within the ASIC.

In an assembly where more than two microphones are coupled together, only one microphone can set to be a master whereas the other microphones are set to be slaves. This means that only the gain information from the master microphone is used to set the gain of the slave microphone(s).

This assembly has the advantage that unitary microphones can be used in this assembly and no differentiation between different kinds of microphones is necessary. The switching between the two settings can be done by an integrated logic. The logic can be realized by an integrated circuit which is external to the microphones. In each microphone, an integrated circuit is provided where different functions can be integrated. A single ASIC per each microphone or signal processing unit is used to realize the amplifier, the automatic gain control and the analog-to-digital converter thereon. In this circuit, other functions can be implemented too, for example, functions which are used to exchange information with other automatic gain control units in other microphones.

The invention has been explained with respect to the given figures but shall not be restricted to the depicted embodiments. Without departing from the invention, further components like filters, for example, can be present in an assembly comprising the given signal processing unit. The application of the assembly shall not be restricted to sensors, like pressure sensors, inertial sensors, or microphones but can be extended to any kind of analog signal sources that are weak and need to be amplified. The signal processing can be done in an analog way in total but can be converted to a digital data stream when coupling the analog data output to an analog-to-digital converter.

The invention claimed is:

1. An assembly with an analog signal processing unit, the assembly comprising:
   an analog signal input;
   an analog signal output;
   a first signal path coupled between the signal input and the signal output;
   a first amplifier within the first signal path, the first amplifier being coupled to the analog signal input;
   an automatic gain control unit comprising a level comparator, wherein the automatic gain control unit is solely coupled to the first signal path to control a gain of the first amplifier in response to a signal amplitude within the first signal path, wherein the automatic gain control unit is configured to switch the gain between different gain settings, and wherein a first gain setting is provided for high sensitivity and low-amplitude signals and a second gain setting is provided for high amplitude signals;
   a gain information output configured to deliver information about a current gain to an interface between the signal processing unit and an external circuitry, wherein a gain information comprises information whether the signal amplitude at the analog signal output is a result of a maximum gain or a result of a gain that is reduced relative to the maximum gain thereby delivering an information about a sensitivity of the signal processing unit, and wherein the gain information is provided as a parameter for further processing of an output signal in the external circuitry; and
   a second signal path and a second amplifier coupled to the second signal path and to the gain information output of the interface of the first signal path such that first and second amplifier are controlled by the same gain, wherein the analog signal output is coupled to an analog-to-digital converter, and wherein the analog-to-digital converter comprises a sigma delta modulator.

2. The assembly according to claim 1, further comprising a sensor transducer coupled to the analog signal input of the first signal path, the sensor transducer configured to deliver an analog input signal to the first signal path in response to a physical parameter detected or measured by the sensor transducer.

3. The assembly according to claim 1, further comprising a sensor transducer coupled to the analog signal input of the first signal path or an analog signal input of the second signal path, the sensor transducer configured to deliver an analog input signal to the first signal path in response to a physical parameter detected or measured by the sensor transducer.

4. The assembly according to claim 1, wherein the first signal path and the second signal path are each arranged within a separate casing, the casings being coupled via respective interfaces.

5. The assembly according to claim 1, further comprising a second automatic gain control unit coupled to the second signal path to control the gain of the second amplifier.

6. The assembly according to claim 5, wherein the first signal path and second signal path have the same components, the second automatic gain control unit configured to be controlled by the automatic gain control unit.

7. The assembly according to claim 6, wherein the automatic gain control unit and the second automatic gain control unit each have a separate terminal at the interface to assign a status to the respective automatic gain control unit chosen from master and slave, the status of the automatic gain control unit being different than the status of the second automatic gain control unit.

8. The assembly according to claim 1, wherein an acousto-electric MEMS transducer is coupled to the analog signal input.

* * * * *